United States Patent
Hasegawa et al.

(10) Patent No.: US 8,039,283 B2
(45) Date of Patent: Oct. 18, 2011

(54) NITRIDE COMPOUND SEMICONDUCTOR ELEMENT AND METHOD FOR MANUFACTURING SAME

(75) Inventors: Yoshiaki Hasegawa, Shiga (JP); Toshiya Yokogawa, Nara (JP); Atsushi Yamada, Osaka (JP); Yoshiaki Matsuda, Hyogo (JP)

(73) Assignee: Panasonic Corporation, Osaka (JP)

( * ) Notice: Subject to any disclaimer, the term of this patent is extended or adjusted under 35 U.S.C. 154(b) by 498 days.

(21) Appl. No.: 12/159,232

(22) PCT Filed: Dec. 20, 2006

(86) PCT No.: PCT/JP2006/325335
§ 371 (c)(1),
(2), (4) Date: Jun. 26, 2008

(87) PCT Pub. No.: WO2007/074688
PCT Pub. Date: Jul. 5, 2007

(65) Prior Publication Data
US 2010/0226401 A1 Sep. 9, 2010

(30) Foreign Application Priority Data
Dec. 26, 2005 (JP) ................................. 2005-371863

(51) Int. Cl.
*H01L 21/301* (2006.01)
*H01S 5/02* (2006.01)
(52) U.S. Cl. ...... 438/46; 438/33; 438/462; 257/E21.238; 148/DIG. 28
(58) Field of Classification Search .................... 438/33, 438/46, 462; 257/E21.237, E21.238; 148/DIG. 28
See application file for complete search history.

(56) References Cited

U.S. PATENT DOCUMENTS

| | | | | |
|---|---|---|---|---|
| 4,610,079 A * | 9/1986 | Abe et al. | ...... | 438/462 |
| 4,997,793 A * | 3/1991 | McClurg | ...... | 438/33 |
| 5,629,233 A * | 5/1997 | Chand et al. | ...... | 438/33 |
| 5,820,006 A * | 10/1998 | Turner | ...... | 225/96 |
| 6,319,747 B1 * | 11/2001 | Todisco et al. | ...... | 438/94 |
| 6,711,193 B2 * | 3/2004 | Yamasaki | ...... | 372/45.01 |
| 7,358,156 B2 * | 4/2008 | Tanaka et al. | ...... | 438/462 |
| 7,397,834 B2 * | 7/2008 | Kozaki et al. | ...... | 372/46.012 |

(Continued)

FOREIGN PATENT DOCUMENTS

JP 62-190892 8/1987

(Continued)

OTHER PUBLICATIONS

International Search Report for corresponding Application No. PCT/JP2006/325335 dated Mar. 6, 2007. Form PCT/ISA/237 and partial English translation.

*Primary Examiner* — Mary Wilczewski
(74) *Attorney, Agent, or Firm* — Renner, Otto, Boisselle & Sklar, LLP

(57) ABSTRACT

The present invention is directed to a production method for a nitride compound semiconductor element including a substrate and a multilayer structure 40 supported by an upper face of the substrate. First, a wafer 1 to be split into individual substrates is provided. A plurality of semiconductor layers composing the multilayer structure 40 are grown on the wafer 1. By cleaving the wafer 1 and the semiconductor layers, a cleavage plane in the multilayer structure 40 is formed. In the present invention, a plurality of voids are arranged at positions in the multilayer structure at which a cleavage plane is to be formed. Thus, cleavage can be performed with a good yield.

6 Claims, 13 Drawing Sheets

U.S. PATENT DOCUMENTS

| | | | |
|---|---|---|---|
| 7,649,923 B2 * | 1/2010 | Sakamoto et al. | 372/54 |
| 7,718,454 B2 * | 5/2010 | Nakamura et al. | 438/30 |
| 7,838,316 B2 * | 11/2010 | Masui | 438/46 |
| 2003/0030053 A1 | 2/2003 | Kawakami et al. | |
| 2005/0116243 A1 * | 6/2005 | Mochida | 257/98 |
| 2006/0094244 A1 * | 5/2006 | Yamada et al. | 438/700 |
| 2006/0108598 A1 * | 5/2006 | Lai et al. | 257/103 |
| 2008/0042244 A1 * | 2/2008 | Anzue et al. | 257/613 |
| 2008/0199983 A1 * | 8/2008 | Nakamura et al. | 438/33 |
| 2009/0022191 A1 * | 1/2009 | Masui | 372/43.01 |

FOREIGN PATENT DOCUMENTS

| | | |
|---|---|---|
| JP | 10-214997 | 8/1998 |
| JP | 10-335699 | 12/1998 |
| JP | 2000-058972 | 2/2000 |
| JP | 2001-085736 | 3/2001 |
| JP | 2003-017791 | 1/2003 |
| JP | 2003-282485 | 10/2003 |
| JP | 2004-022785 | 1/2004 |
| JP | 2010-225756 | * 10/2010 |

* cited by examiner

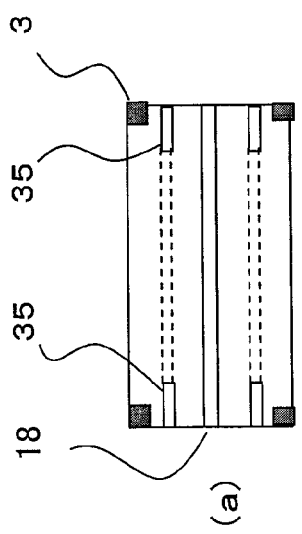
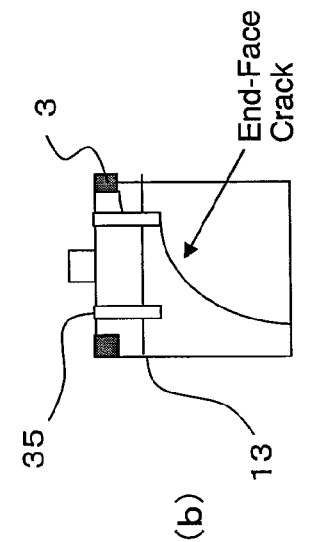
FIG.10
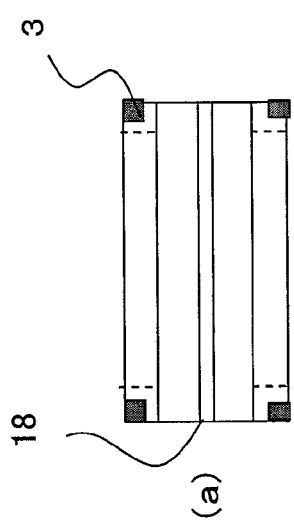
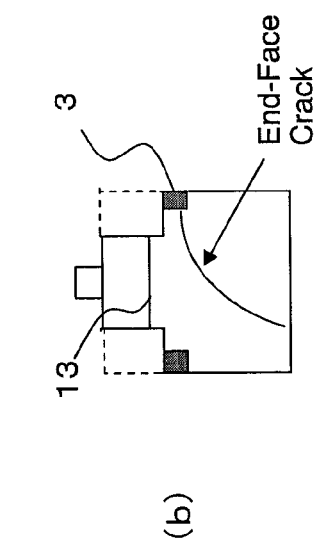
FIG.11
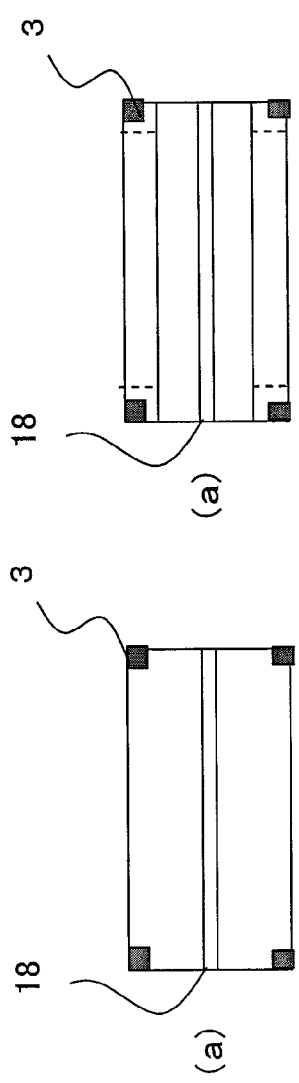
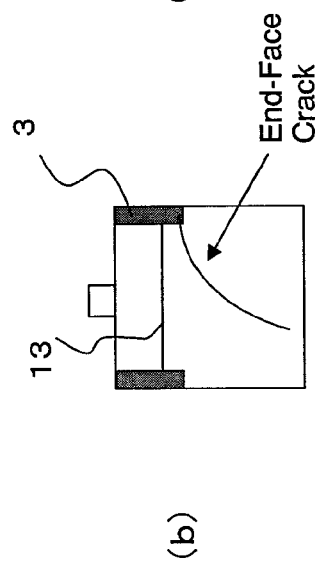
FIG.12

NITRIDE COMPOUND SEMICONDUCTOR ELEMENT AND METHOD FOR MANUFACTURING SAME

TECHNICAL FIELD

The present invention relates to a nitride compound semiconductor element and a production method therefor.

BACKGROUND ART

A band gap of a nitride compound semiconductor whose composition is expressed by the general formula $In_xGa_yAl_zN$ (where $x+y+z=1$, $0 \leq x \leq 1$, $0 \leq y \leq 1$, $0 \leq z \leq 1$) may have a size corresponding to blue light or ultraviolet light through adjustment of the mole fraction of each element. Therefore, there have been vigorous research activities directed to light-emitting devices, e.g., semiconductor lasers, that comprise a nitride compound semiconductor as an active layer.

FIG. 1 shows the crystal structure of a nitride compound semiconductor. As shown in FIG. 1, a nitride compound semiconductor has a crystal structure of a hexagonal-system. Therefore, when fabricating a semiconductor laser which is constructed so that its upper face (principal face) is the (0001) plane and its resonator end faces are the M-plane (1-100), cleavage is likely to occur not along an A-plane which is perpendicular to these planes, but along a crystal plane which is tilted by 30° from the A-plane. As a result, there is a problem in that, not only when performing cleavage along the A-plane, but also when forming cleavage along the M-planes (1-100) to form the resonator end faces, miscleavage (end-face cracks) is likely to occur in a direction which is tilted by 60° from the M-plane (1-100).

Due to this problem, it has conventionally been very difficult to fabricate a nitride compound semiconductor element having smooth resonator end faces.

A sapphire substrate, which has conventionally been widely used as a substrate for nitride compound semiconductor elements, is not capable of cleaving. Therefore, when forming a semiconductor laser having a sapphire substrate, it has been practiced to perform scribing along the M-plane from the side of a nitride compound semiconductor layer that is grown on a sapphire substrate to thus form a scratch in the nitride compound semiconductor layer, this being an attempt to facilitate the formation of a cleavage plane.

Patent Document 1 discloses a method which involves performing an edge scribing for a nitride compound semiconductor layer, and thereafter performing a cleavage through breaking.

Similarly in the case of cleaving a semiconductor laser comprising a GaN substrate, which is being used in the recent years, it has been practiced to form scribing grooves along the M-plane from the side of a nitride compound semiconductor layer that is grown on the GaN substrate, this being an attempt to facilitate cleavage. Patent Document 2 discloses a method of, after linearly forming scribing grooves in a nitride compound semiconductor layer, performing a cleavage through breaking.

[Patent Document 1] Japanese Laid-Open Patent Publication No. 2000-058972

[Patent Document 2] Japanese Laid-Open Patent Publication No. 2003-17791

DISCLOSURE OF INVENTION

Problems to be Solved by the Invention

However, according to the aforementioned conventional technique, since scratches are formed in the nitride compound semiconductor layer through scribing or dicing, there is a problem in that "burrs", "chipping", "end-face cracks", scribing dust, and the like are likely to occur, thus resulting in a reduced production yield. There is also a problem in that, since the active layer is likely to suffer from strain and crystal defects, scratches and ruggednesses may occur in a resonator end face (light-outgoing surface), thus deteriorating the optical characteristics and reliability.

The present invention has been made in order to solve the aforementioned problems, and a main objective thereof is to provide a nitride compound semiconductor element which allows cleavage to be performed with a good yield, and a production method therefore.

Means for Solving the Problems

A production method for a nitride compound semiconductor element according to the present invention is a production method for a nitride compound semiconductor element including a substrate having an upper face and a lower face and a multilayer structure supported by the upper face of the substrate, the production method comprising: a step of providing a wafer to be split into the substrate; a step of growing a plurality of semiconductor layers composing the multilayer structure on the wafer; and a step of performing cleavage of the wafer and the multilayer structure to form a cleavage plane, further comprising a step of arranging a plurality of voids at positions where the cleavage plane is to be formed.

In a preferred embodiment, a cross section of each void in a plane which is parallel to the wafer is sized and shaped so as to be accommodated within a rectangular region of 10 μm × 10 μm.

In a preferred embodiment, the step of arranging the plurality of voids comprises a step of pressing a tip of a needle piece against an upper face of the multilayer structure to form depressions on the multilayer structure, the depressions functioning as the voids.

In a preferred embodiment, an angle formed between a direction which is perpendicular to the wafer and a pressing direction when the tip of the needle piece is abutted against the upper face of the multilayer structure is set to 5° or more.

In a preferred embodiment, the nitride compound semiconductor element is a semiconductor laser having as a resonator end face a cleavage plane which is parallel to a plane containing the pressing direction.

A nitride compound semiconductor element according to the present invention is a nitride compound semiconductor element comprising a substrate having an upper face and a lower face and a multilayer structure supported by the upper face of the substrate, such that the substrate and the multilayer structure have at least two cleavage planes, wherein, the multilayer structure includes at least one void which is in contact with either of the two cleavage planes.

In a preferred embodiment, the upper face of the substrate has a rectangular shape, and the void is located at at least one of four corners of the upper face of the substrate.

In a preferred embodiment, a cross section of the void in a plane which is parallel to the upper face of the substrate is sized and shaped so as to be accommodated within a rectangular region of 10 μm × 10 μm.

In a preferred embodiment, the multilayer structure has a laser resonator structure including: an n-type nitride compound semiconductor layer and a p-type nitride compound semiconductor layer; and an active layer interposed between the n-type nitride compound semiconductor layer and the p-type nitride compound semiconductor layer, at least a portion of the cleavage planes functioning as a resonator end face.

In a preferred embodiment, an interval between a bottom of the void and the substrate is smaller than an interval between the active layer and the substrate.

In a preferred embodiment, a trench is formed between a laser optical waveguide portion and the void in the multilayer structure.

In a preferred embodiment, an interval between the bottom of the trench and the substrate is smaller than an interval between the active layer and the substrate.

In a preferred embodiment, the substrate is a nitride compound semiconductor.

A preferred embodiment comprises a rear electrode formed on the lower face of the substrate, wherein, the rear electrode has a planar pattern which allows the void to be visually recognized through the lower face of the substrate.

EFFECTS OF THE INVENTION

According to the present invention, the arrangement of voids contributes to an accurate positioning of cleavage planes, and therefore the production yield of a nitride compound semiconductor, which is difficult to be cleaved, is greatly improved. As compared to scribing grooves, the voids have a sufficiently small size along the cleavage plane direction. Therefore, positioning accuracy of the cleavage planes can be enhanced with respect to both primary cleavage and secondary cleavage. Moreover, since dot-like voids are arranged in a discrete manner, it becomes possible to suppress deviation of cleavage planes as compared to the case of linear scribing grooves.

BRIEF DESCRIPTION OF DRAWINGS

[FIG. 10] (a) is an upper face showing another embodiment of the semiconductor element according to the present invention; and (b) is a cross-sectional view thereof.

[FIG. 11] (a) is an upper plan view showing still another embodiment of the semiconductor element according to the present invention; and (b) is a cross-sectional view thereof.

[FIG. 12] (a) is an upper plan view showing still another embodiment of the semiconductor element according to the present invention; and (b) is a cross-sectional view thereof.

Figure 1:
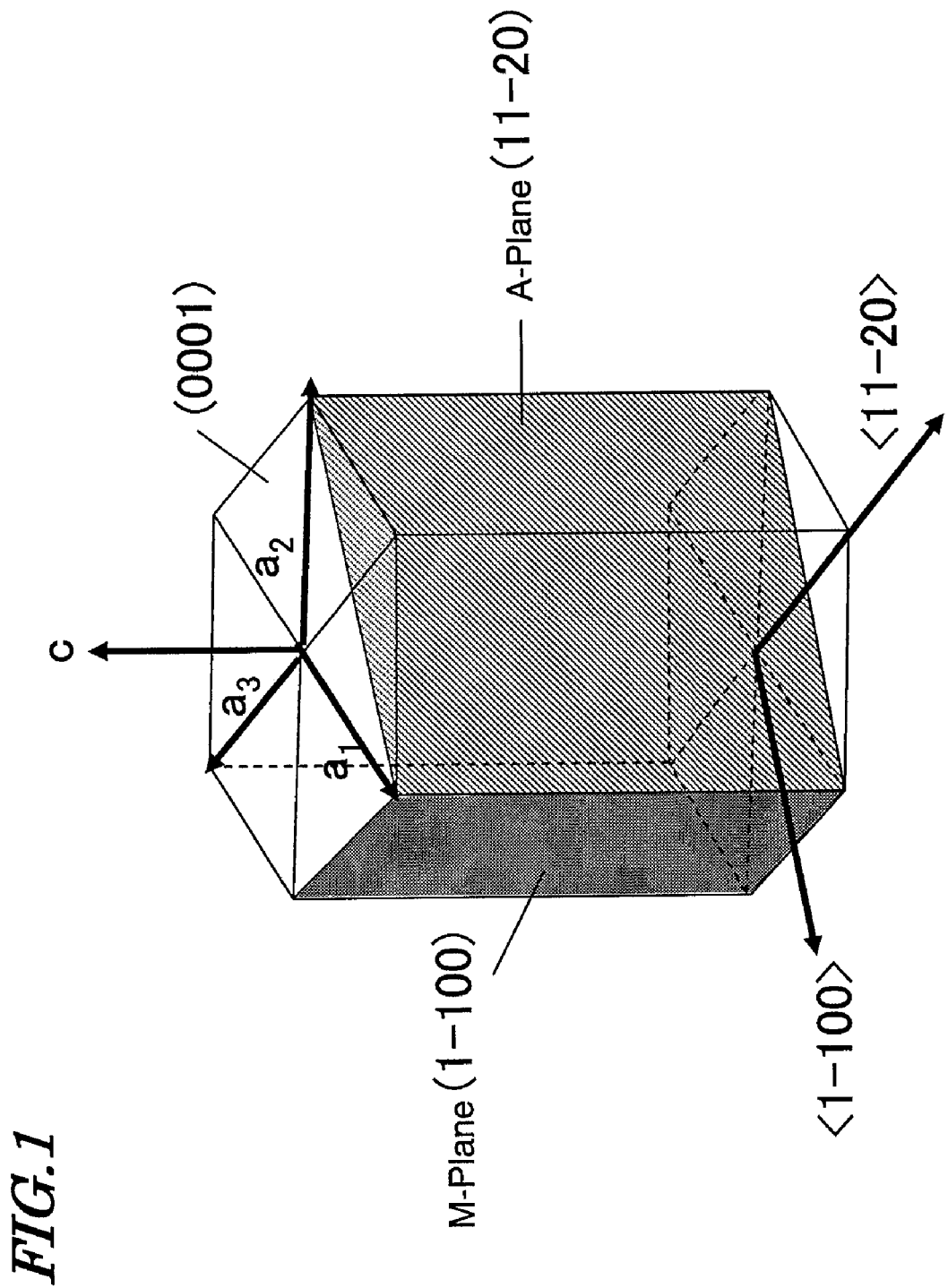
[FIG. 1] A perspective view showing the crystal structure of a nitride compound semiconductor.

DESCRIPTION OF THE REFERENCE NUMERALS 1 wafer
10 n-type GaN layer
11 cladding layer of n-type $Al_{0.04}Ga_{0.96}N$
12 first optical guide layer of n-type GaN
13 multi-quantum well active layer
14 capping layer of p-type $Al_{0.15}Ga_{0.85}N$
15 second optical guide layer of p-type GaN
16 p-type cladding layer of p-type $Al_{0.05}Ga_{0.95}N$
17 p-type contact layer of p-type GaN
20 electrode layer (rear electrode)
30 linear void (scribing groove)
35 trench
45 needle piece for forming voids
300 void

BEST MODE FOR CARRYING OUT THE INVENTION

A nitride compound semiconductor element according to the present invention includes a substrate having an upper face and a lower face, and a multilayer structure which is supported by the upper face of the substrate, such that the substrate and the multilayer structure have at least two cleavage planes. In the present invention, in order to facilitate "cleavage" of a crystal during its production steps, a plurality of "voids" are arranged on the upper face of a multilayer structure which is provided on a wafer to become a substrate. Since cleavage occurs along the arrangement of voids, (at least a portion of) a void(s) exists in most of the semiconductor elements that are finally obtained.

Voids are arranged in a discrete manner in the wafer plane, and have a size which is sufficiently small relative to an interval between two cleavage planes of parallel relationship. In a plane which is parallel to the wafer plane, a void is preferably sized so as to be contained in a rectangular region of 10 μm (vertical)×10 μm (horizontal). By performing cleavage by utilizing an arrangement of such small voids, various effects which will be specifically described later are enabled.

Hereinafter, with reference to the drawings, main features of the nitride compound semiconductor element according to the present invention will be described. The nitride compound semiconductor element according to the present invention is preferably a semiconductor laser whose cleavage planes are utilized as resonator end faces, but may be any other light-emitting device, e.g., an LED (Light Emitting Diode), or a transistor. Although a semiconductor element other than a semiconductor laser does not utilize its cleavage planes as resonator end faces, the ability to separate a hard nitride compound into chips with a good yield through cleavage produces advantages such as facilitated production.

Figure 2:
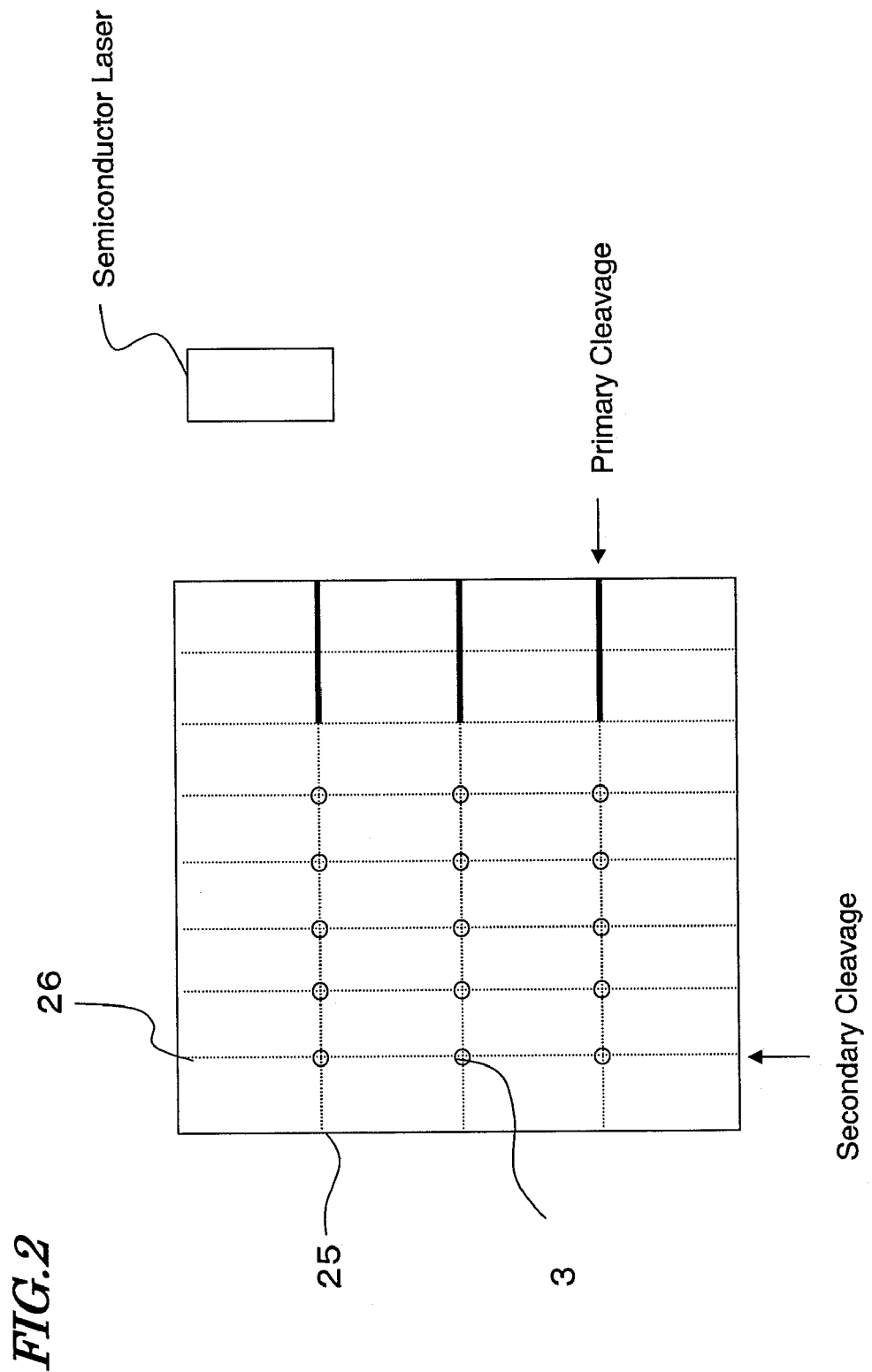
[FIG. 2] A plan view showing the relationship between an arrangement of voids 3 and cleavage directions.

First, FIG. 2 is referred to. FIG. 2 is an upper plan view of a wafer having a multilayer structure formed on an upper face thereof.

In the example shown in FIG. 2, dot-like voids 3 are provided at points where lines 25 intersect lines 26. Herein, after a primary cleavage is performed along the lines 25, a secondary cleavage is performed along the lines 26. Each region surrounded by two adjoining lines 25 and two adjoining lines 26 constitutes an individual semiconductor laser (chip).

The voids 3 can easily be formed by pressing the tip of a needle piece against the upper face of a multilayer structure. For example, the tip of a needle piece which is composed of diamond may be processed so as to have a diameter of about several μm, and, via pressing, minute depressions which lie discretely in a two-dimensional manner can be formed on the upper face of a multilayer structure. Rather than being "scribing grooves" which extend longitudinally in a direction that is parallel to the wafer plane, these depressions are shaped so as to relatively approximate "points", thus being able to appropriately guide not only primary cleavage along the lines 25 but also guide secondary cleavage along the lines 26.

Cleavage can be begun by, after scribing scratches are formed near a wafer end face at positions for forming cleavage planes, applying a force from the wafer rear face to the portions where the scribing scratches are formed, by using a breaking apparatus. The three thick solid lines shown in FIG. 2 show scribing scratches which are provided for the sake of primary cleavage.

Hereinafter, preferable embodiments of the present invention will be described.

Embodiment 1

Figure 3:
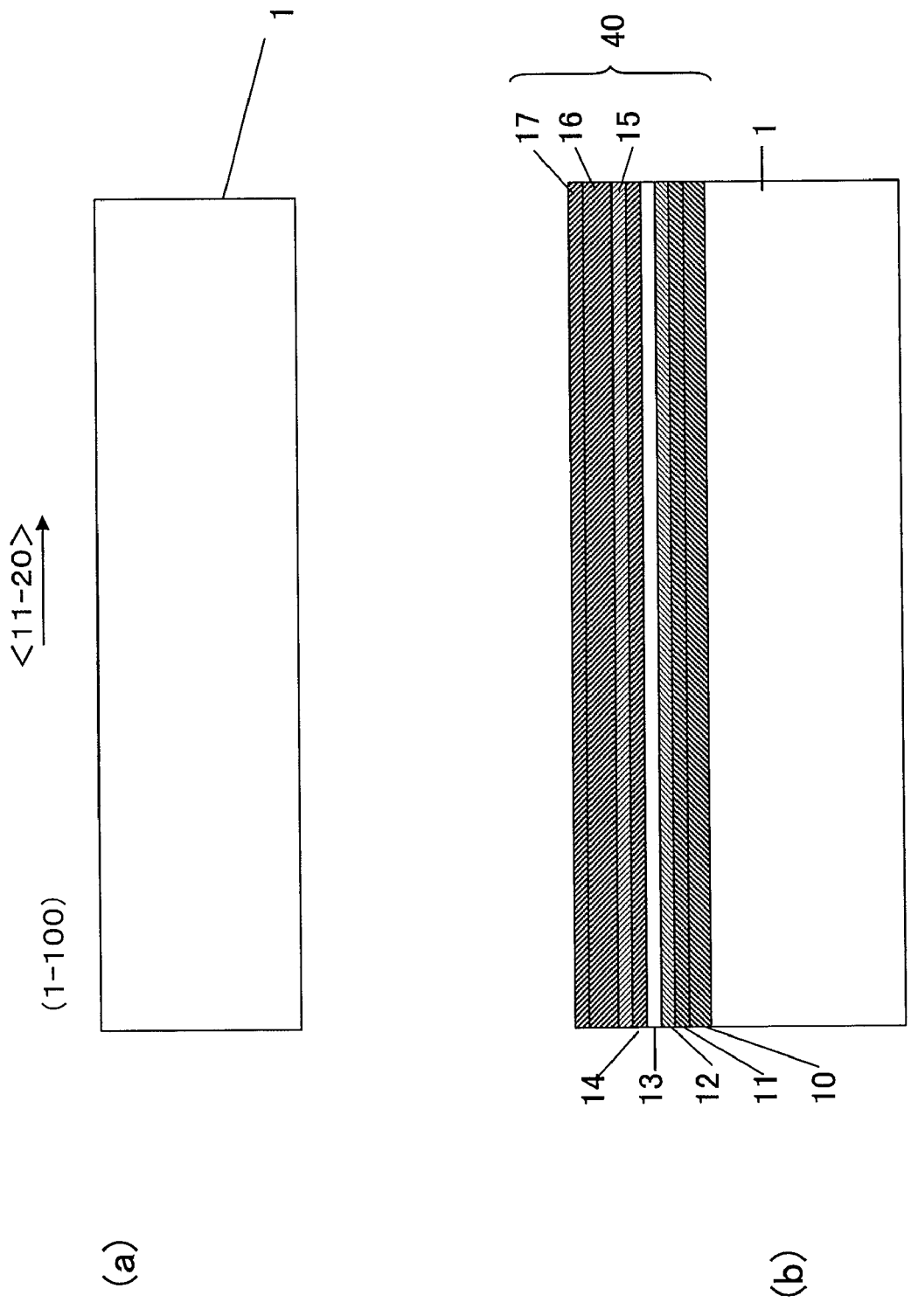
[FIGS. 3] (a) and (b) are cross-sectional views showing steps of forming a multilayer structure on a wafer according to an embodiment of the present invention.

First, with reference to FIGS. 3(a) and 3(b), processes of stacking semiconductor layers on an upper face of a wafer 1 will be described. FIGS. 3(a) and 3(b) are partial cross-sectional views. In actuality, the illustrated portion is merely a part of a wafer which is sized with a diameter of about 50 mm.

As shown in FIG. 3(a), a GaN wafer 1 whose upper face is the (0001) plane is provided. Note that the cross section of the GaN wafer 1 that is shown in FIGS. 3(a) and 3(b) is the (1-100) plane, which will be exposed through primary cleavage. The <11-20> direction lies in the plane of the figure, and is parallel to the upper face (0001) of the GaN wafer 1.

Next, as shown in FIG. 3(b), a multilayer structure 40 of a nitride compound semiconductor is formed on the GaN wafer 1. In the present embodiment, a metal-organic vapor phase epitaxy (MOVPE) technique is used to grow layers of nitride compound semiconductor expressed as $In_xGa_yAl_zN$ (where $x+y+z=1$, $0 \leq x \leq 1$, $0 \leq y \leq 1$, $0 \leq z \leq 1$). Specifically, the multilayer structure 40 is formed as described below.

First, the GaN wafer 1 is retained on a susceptor in a reactor of MOVPE equipment. Then, the reactor is heated to about 1000° C., and source gases, i.e., trimethylgallium (TMG) and ammonia ($NH_3$) gas, and a carrier gas of hydrogen and nitrogen are simultaneously supplied, and silane ($SiH_4$) gas is supplied as an n-type dopant, thus allowing an n-type GaN layer 10 having a thickness of about 1 μm and an Si impurity concentration of about $5 \times 10^{17}$ cm$^{-3}$ to grow.

Thereafter, while also supplying trimethylaluminum (TMA), an n-type cladding layer 11 composed of n-type $Al_{0.04}Ga_{0.96}N$ with a thickness of about 1.8 μm and an Si impurity concentration of about $5 \times 10^{17}$ cm$^{-3}$ is grown. Then, after growing a first optical guide layer 12 composed of n-type GaN with a thickness of about 150 nm and an Si impurity concentration of about $5 \times 10^{17}$ cm$^{-3}$, the temperature is lowered to about 800° C., the carrier gas is changed to nitrogen only, and trimethylindium (TMI) and TMG are supplied, thus growing quantum wells (three layers) composed of $In_{0.10}Ga_{0.90}N$ with a film thickness of about 3 nm and a multi-quantum well active layer 13 composed of $In_{0.02}Ga_{0.98}N$ barrier layers (two layers) with a film thickness of about 9 nm.

The temperature within the reactor is again elevated to about 1000° C., hydrogen is mixed to the carrier gas, and while supplying a p-type dopant of biscyclopentadienylmagnesium ($Cp_2Mg$) gas, a capping layer 14 composed of p-type $Al_{0.15}Ga_{0.85}N$ with a film thickness of about 10 nm and an Mg impurity concentration of about $1 \times 10^{19}$ cm$^{-3}$ is grown.

Next, a second optical guide layer 15 composed of p-type GaN with a thickness of about 120 nm and an Mg impurity concentration of about $1 \times 10^{19}$ cm$^{-3}$ is grown. Thereafter, a p-type cladding layer 16 composed of p-type $Al_{0.05}Ga_{0.95}N$ with a thickness of about 0.5 μm and an impurity concentration of about $1 \times 10^{19}$ cm$^{-3}$ is grown. Finally, a p-type contact layer 17 composed of p-type GaN with a thickness of about 0.1 μm and an Mg impurity concentration of about $1 \times 10^{20}$ cm$^{-3}$ is grown.

Note that, in carrying out the present invention, the specific construction of the multilayer structure 40 and the method for growing semiconductor layers may be arbitrarily chosen, and the aforementioned construction and growth method are only exemplary.

After the multilayer structure 40 is formed, a step of forming stripe ridges for current confinement, a step of forming electrodes, a step of polishing the rear face of the wafer 1, and the like are performed, after which a step of forming the voids 3 is performed. Note that, in the step of polishing the rear face of the wafer 1, the thickness of the wafer 1 is reduced to about 100 μm.

Hereinafter, with reference to FIG. 4, an exemplary arrangement of the voids 3 and a method for forming the voids 3 will be described. For simplicity, the detailed construction of the multilayer structure 40 is not shown in FIG. 4. Moreover, the aforementioned ridge stripes, electrodes, and the like will be present on the upper face of an actual multilayer structure 40, which is not smooth as shown in FIG. 4.

The voids 3 in the present embodiment are arranged in a discrete manner in a matrix shape along the <11-20> direction and along <1-100>, and do not intersect optical waveguides 18 which are formed in the multilayer structure 40. The distance between two adjoining voids 3 along the <11-20> direction is set to be substantially the same value as the size along the <11-20> direction (chip width) of the finally-obtained laser device. In the present embodiment, the size along the <11-20> direction of each laser device is about 200 μm, and therefore the arraying pitch of the voids 3 along the <11-20> direction is also set at 200 μm. On the other hand, the arraying pitch of the voids 3 along the <1-100> direction is set at a value which is equal to the resonator length of each laser device. In the present embodiment, the resonator length is about 600 μm, and therefore the arraying pitch of the voids 3 along the <1-100> direction is also set at 600 μm. Note that the size of the laser device is not limited to the aforementioned values, but the arrangement interval of the voids 3 may be set to any appropriate value in accordance with the size of the laser device.

In a plane which is parallel to the upper face of the wafer 1, each void 3 is set to a size of 10 μm×10 μm or less. In a cross section which is parallel to the upper face of the wafer 1, each void 3 typically has a circular shape (with a diameter of about 3 μm), but may also have an elliptic shape. In the case where the cross section shape is an ellipse, its size along the major axis direction may be set to e.g. about 5 to 6 μm, and its size along the minor axis direction may be set to e.g. about 2 to 3 μm. Note that the depth of each void 3 is about 2 to 7 μm. Thus, by arranging, along lines 25 and lines 26 shown in FIG. 4, the voids 3 which are sufficiently small relative to the size of each laser device, it becomes possible to perform both of primary and secondary cleavages at accurate positions.

Figure 4:
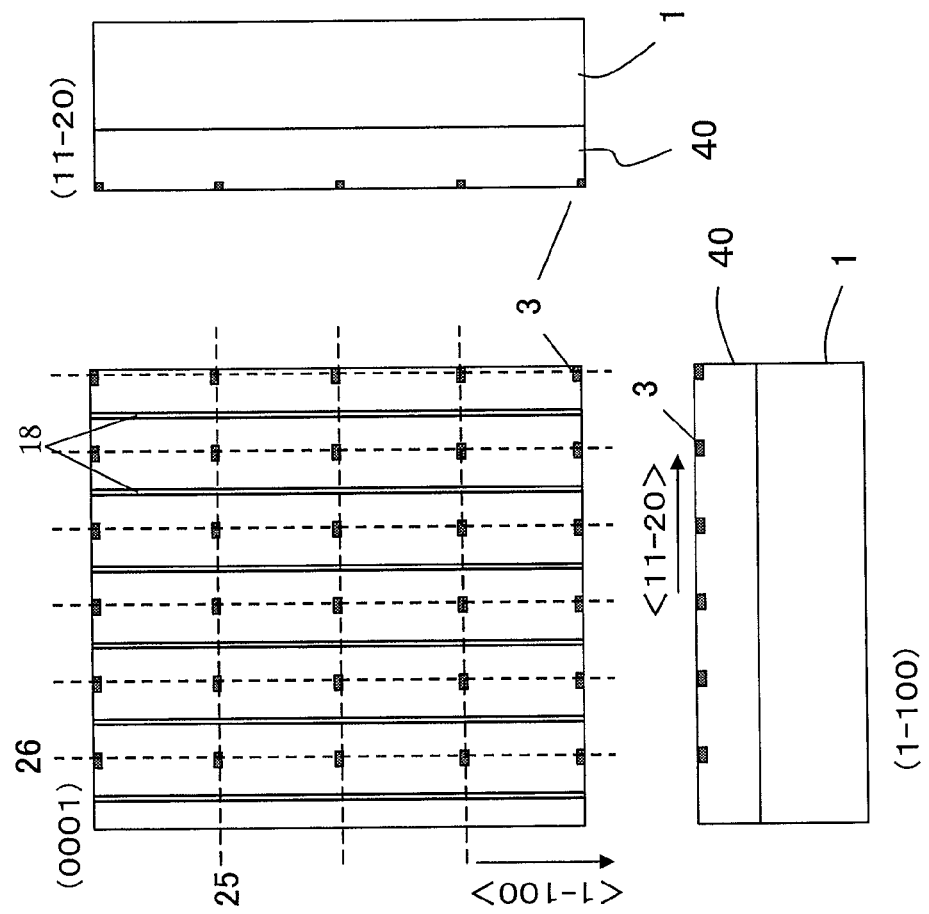
[FIG. 4] A diagram showing an arrangement of voids 3 according to Embodiment 1 of the present invention.

Each line 25 shown in FIG. 4 is defined by a row of plural voids 3 which are arranged along the <11-20> direction, and primary cleavage is to take place along these lines 25. On the other hand, secondary cleavage is to take place along the lines 26. Therefore, preferably, the voids 3 are disposed at the intersections (lattice points) where the lines 25 intersect the lines 26. However, it is not necessary to provide a void 3 at every intersection where a line 25 intersects a line 26.

Figure 5:
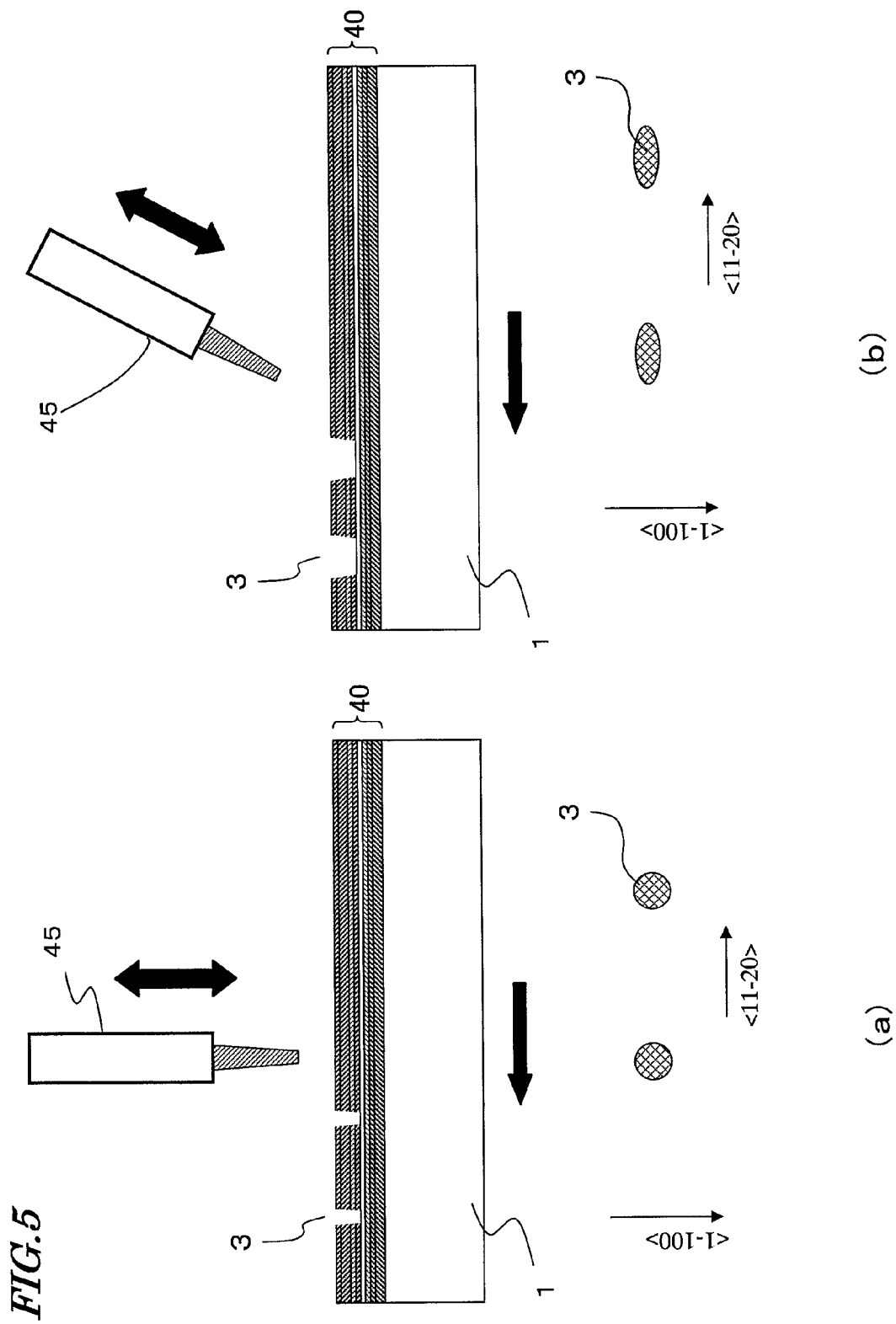
[FIGS. 5] (a) and (b) are diagrams each schematically showing a method for forming the voids 3.

FIG. 5(a) and FIG. 5(b) are diagrams each schematically showing a step of forming the voids 3. For simplicity, stripe ridges and electrodes are omitted from illustration in FIG. 5.

In the example shown in FIG. 5(a), a needle piece 45 is moved up and down along a direction which is perpendicular to the upper face of the wafer 1, thus forming depressions (voids) on the multilayer structure 40 in a discrete manner. The wafer 1 may be moved in synchronization with the up-down motion of the needle piece 45, whereby minute depressions (voids) can be formed at the positions of the lattice points shown in FIG. 4. In a lower portion of FIG. 5(a), a planar shape of the depressions (voids 3) to be formed is schematically shown. For simplicity, in the example shown in the lower portion of FIG. 5(a), the voids 3 are illustrated as having an isotropic shape in a plane which is parallel to the surface of the wafer 1. However, by adjusting the cross section shape of the tip of the needle piece 45, it becomes possible to form voids 3 with a variety of shapes. In order to guide cleavage along a predetermined direction, it is preferable that each individual void 3 has an anisotropic shape with a longitudinal axis extending along the cleavage direction.

In the example shown in FIG. 5(b), the needle piece 45 is tilted from the direction which is perpendicular to the upper face of the wafer 1. By introducing such a tilt, as shown in a lower portion of FIG. 5(b), depressions of a shape that is somewhat elongated along the <11-20> direction (which is the direction of primary cleavage) are formed. In the case where the tip of the needle piece 45 has a triangular pyramid shape, for example, performing the pressing maneuver in a tilted state such that a ridge line (edge) of the triangular pyramid is turned toward the wafer 1 will allow depressions to be formed with an even smaller force on the upper face of the multilayer structure 40. By obliquely pressing the needle piece 45, abrasive deterioration of the needle piece can be suppressed. Preferably, the angle formed between the pressing direction and the direction which is perpendicular to the wafer is set to 5° or more, and is set in a range of 10° to 45°, for example.

Figure 6:
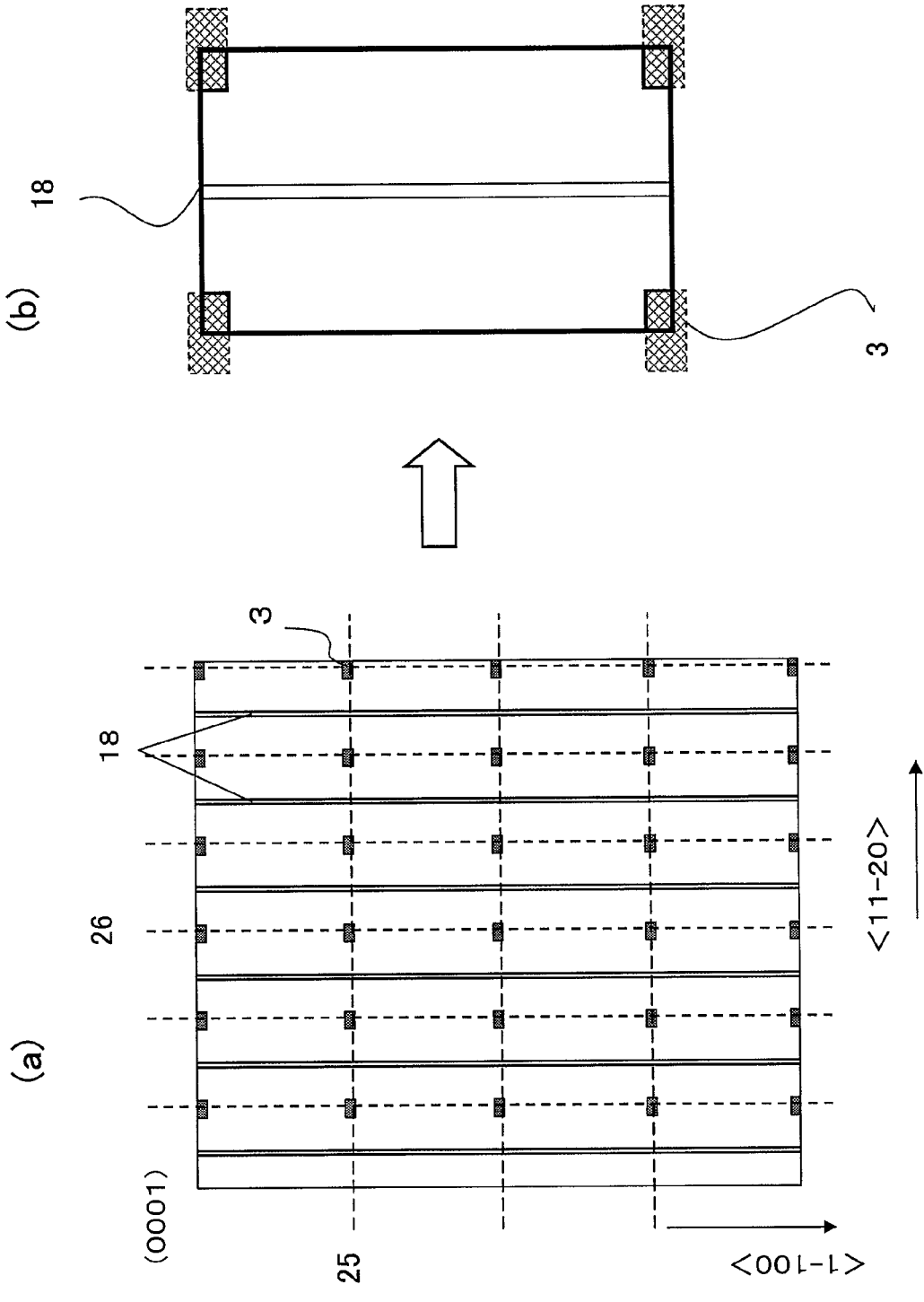
[FIG. 6] (a) is a diagram showing a state before cleavage steps; and (b) is a diagram showing one of individual chips after cleavage.

Hereinafter, with reference to FIGS. 6(a) and (b), cleavage steps will be described. FIG. 6(a) shows a state before the split, whereas FIG. 6(b) shows one of the individual split-chips.

After forming the voids 3 with the aforementioned method, a primary cleavage is performed along the lines 25 shown in FIG. 6(a). At this time, a stress may be applied from the rear face of the wafer 1 by using an apparatus which is not shown, whereby cleavage will progress along a plurality of voids 3 arranged along the lines 25 which are parallel to the <11-20> direction. As a result, occurrence of miscleavage (end-face cracks) in the 60° direction is suppressed, so that laser bars having smooth resonator end faces of the M-plane, i.e., the (1-100) plane, are fabricated.

According to the present embodiment, the presence of the voids 3 makes it difficult for disruption of the laser bars due to the aforementioned cracks to occur. Thus, it is possible to make long laser bars, reduce the production cost as a result of improving the production efficiency, and improve the yield.

Next, after forming a dielectric protection film composed of niobium oxide ($Nb_2O_5$) on one (outgoing side) of the resonator end faces of each laser bar obtained through the primary cleavage and a multilayered dielectric film composed of $SiO_x$ and $Nb_2O_5$ on the other (reflecting side), a secondary cleavage is performed along the lines 26, whereby laser chips (individual semiconductor lasers) are separated from each laser bar. Each semiconductor laser includes as its substrate a chip which has been split from the wafer 1.

After the cleavage steps are finished in this manner, via solder, each semiconductor laser is placed in such a manner that its n-side portion is in contact with the upper face of a submount which is composed of aluminum nitride (AlN) or the like, and wiring is performed via wire bonding. At this time, by taking advantage of the voids 3 being in specific positions of the laser device, the voids 3 can also exhibit a function as positioning markers during the packaging step.

The laser device which has been produced by the above method has smooth resonator surfaces. At room temperature, continuous oscillation was confirmed at an operating current of 80 mA, with a threshold current of 30 mA and an output power of 75 mW, and a lifespan of 1000 hours or more was exhibited.

Although cleavage is also performed along the lines 26 in the above example, the faces other than the resonator end faces do not need to be cleavage planes. Therefore, cutting with laser, etc., may be performed along the lines 26. However, since the voids 3 according to the present invention have a sufficiently small size along the <11-20> direction, an advantage is provided in that secondary cleavage can be carried out with a good yield.

Although cleavage is occurring at positions traversing the voids 3 in the example shown in FIG. 6(b), the cleavage planes do not always need to traverse the voids 3, but instead may be formed near the voids 3. As shown in FIG. 6(b), when first order and secondary cleavages occur so as to traverse the voids 3, a portion(s) of a void(s) 3 will be contained at the four corners of each semiconductor laser chip that is finally obtained. However, each individual semiconductor laser does not need to contain portions of voids 3 in all of its four corners. Depending on the position of the cleavage plane, the number of (a portion or a whole of) voids 3 to be contained in each individual semiconductor laser may fluctuate. In an extreme case, a given semiconductor laser may finally contain no void 3. In such a case, a semiconductor laser adjoining that semiconductor laser will contain at least one void 3.

The interior of the voids 3 may be filled also with materials other than air. Although cleavage is possible even if the interior of the voids 3 is filled with some material, cleavage will be facilitated in the case where it is not filled with a solid material.

Next, with reference to FIG. 7 and FIG. 8, the reason why voids are superior to linear voids (scribing grooves) will be described.

Figure 7:
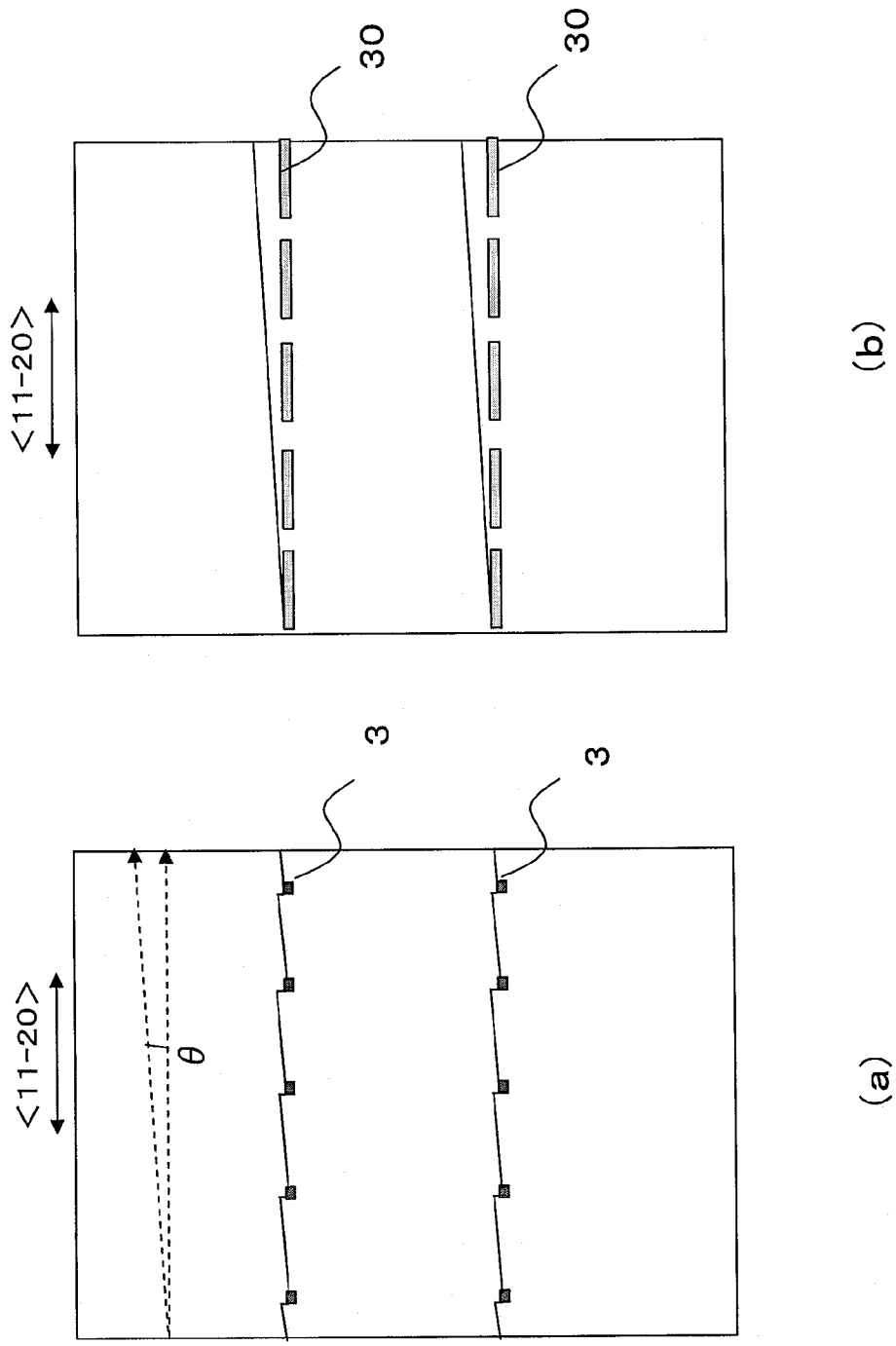
[FIG. 7] (a) is a plan view showing a manner of primary cleavage according to an embodiment of the present invention; and (b) is a plan view showing a manner of primary cleavage in Comparative Example.

FIG. 7(a) is a plan view showing a manner of primary cleavage according to an embodiment of the present invention; and FIG. 7(b) is a plan view showing a manner of primary cleavage in Comparative Example. In the embodiment of the present invention, each void 3 is able to serve as a point from which to begin cleavage, and therefore, even if an angle θ is deviated during primary cleavage, the position of the cleavage plane will be corrected at each void 3 as the cleavage progresses (self-restoration of cleavage positions). As a result, the cleavage plane will not greatly deviate from its intended position. On the other hand, in Comparative Example where scribing grooves of length exceeding 40 µm are arranged, as shown in FIG. 7(*b*), once a cleavage plane begins to deviate, the cleavage plane is likely to greatly deviate from the intended position because the scribing grooves 30 do no have the function of correcting the deviation.

Figure 8:
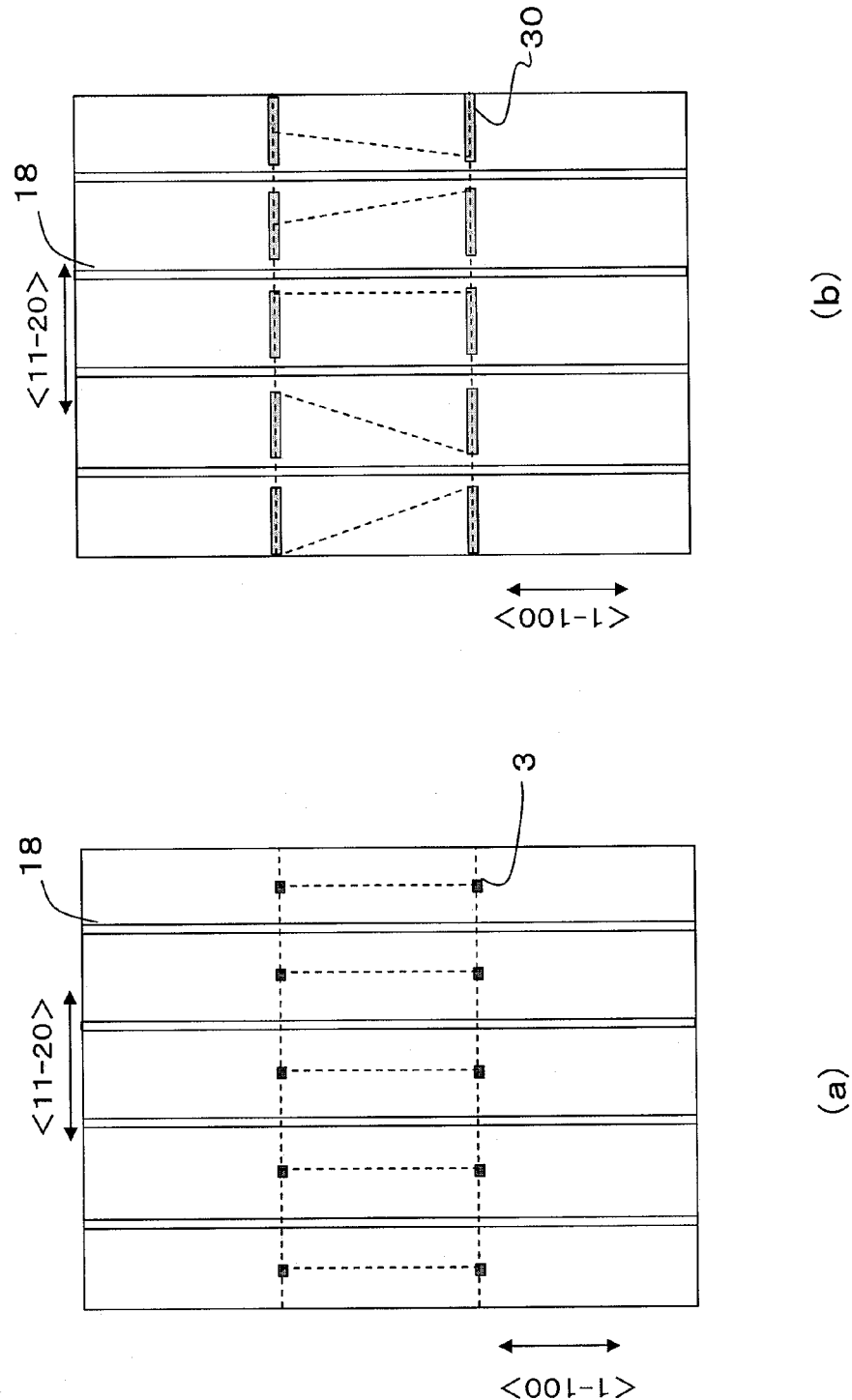
[FIG. 8] (a) is a plan view showing a manner of secondary cleavage according to an embodiment of the present invention; and (b) is a plan view showing a manner of secondary cleavage in Comparative Example.

FIG. 8(*a*) is a plan view showing a manner of secondary cleavage according to an embodiment of the present invention; and FIG. 8(*b*) is a plan view showing a manner of secondary cleavage in the Comparative Example. In FIG. 8, cleavage planes are shown by broken lines. In the case where secondary cleavage is performed along the <1-100> direction, the voids 3 in the present embodiment effectively exhibit a function of positioning the cleavage planes (improvement in the A-plane accuracy). This is because the voids 3 have a sufficiently small size along a direction which is perpendicular to the <1-100> direction. On the other hand, in the Comparative Example, as shown in FIG. 8(*b*), scribing grooves extend longitudinally along a direction which is perpendicular to the <1-100> direction, so that the function of defining the positions of secondary cleavage planes cannot be fully exhibited, and the cleavage planes are likely to greatly deviate from their intended positions.

As is clear from the foregoing, in order to allow the effect of positioning the cleavage planes to be fully exhibited regarding not only primary cleavage (M-plane cleavage) but also secondary cleavage (A-plane cleavage), it is preferable that the voids for inducing or guiding cleavage are in the shape of dots. Moreover, it is most preferable that a dot-like void is located at each of the intersections between lines 25 and 26 shown in FIG. 6.

Hereinafter, a preferable method of forming electrodes for allowing cleavage to be performed appropriately will be described.

Figure 9:
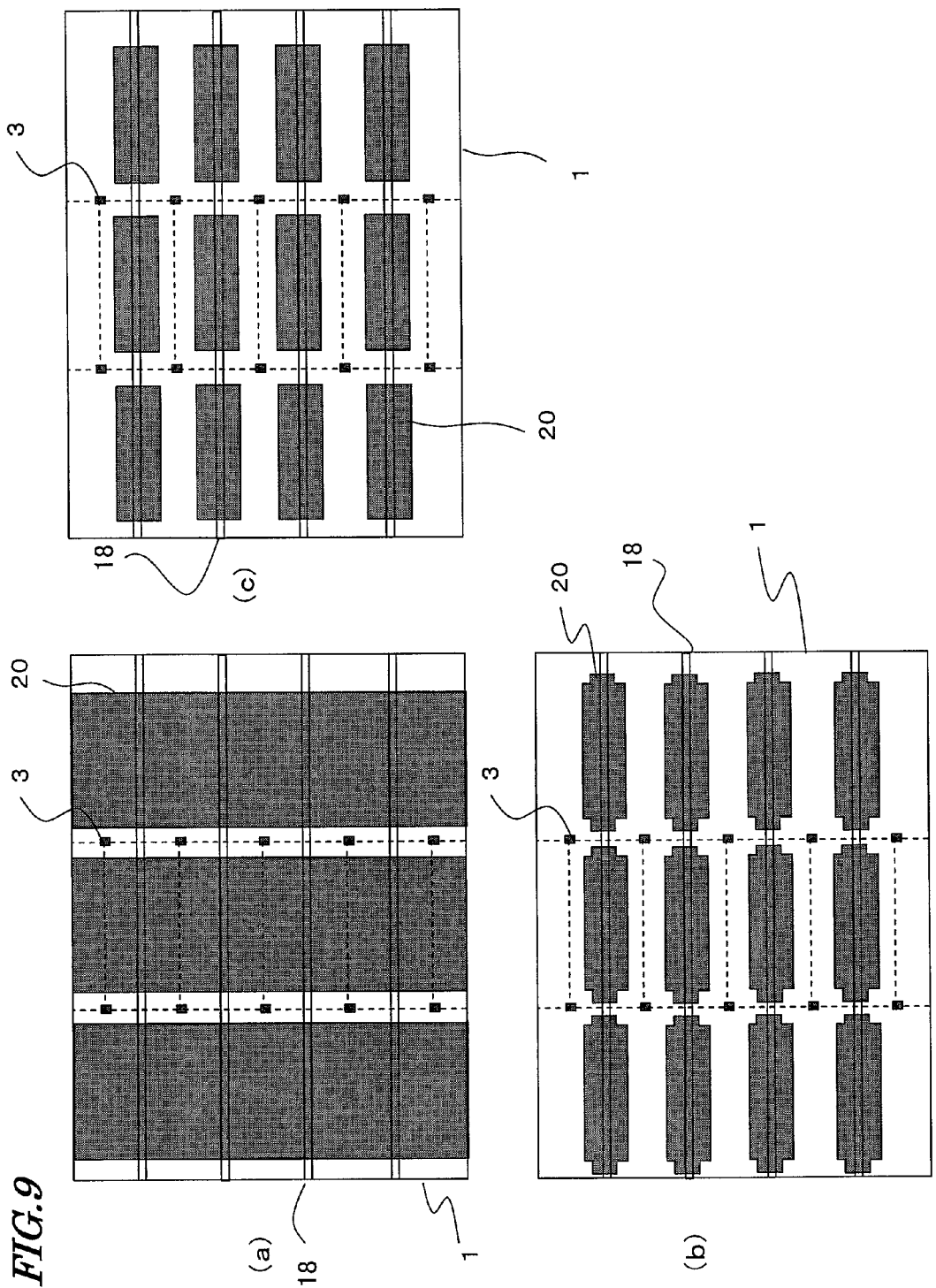
[FIGS. 9] (a) to (c) are plan views showing rear electrode patterns according to preferable embodiments of the present invention.

Since GaN transmits visible light, it is possible to visually recognize the voids 3 through the rear face of the wafer 1 of GaN. Therefore, in the case where an electrode layer is formed on the rear face of the wafer 1, it is preferable to pattern the electrode layer 20 into shapes as shown in FIGS. 9(*a*) to (*c*). In each of the examples shown in FIG. 9, aperture regions for allowing the voids 3 to be visually recognized through the lower face (rear face) of the wafer 1 are formed in the electrode layer 20. Note that the aperture regions in the electrode layer 20 on the rear face of the wafer 1 should be as narrow as possible at the ridge positions to become current injection paths, as shown in FIG. 9(*c*). The reason is as follows. When a current is injected at a ridge position, there is a large heat generation near the active layer under the ridge, and in the case of operation with a high output power, there is also a large local heat generation at the laser end faces. Therefore, by increasing the area of the underlying electrode layer 20, release of heat to the submount can be performed efficiently.

Next, with reference to FIG. 10 to FIG. 12, more preferable embodiments of the semiconductor element according to the present invention will be described.

In the semiconductor laser device shown in FIG. 10, the voids 3 are formed so as to be deeper than the position of the active layer 13. At cleavage, "miscleavage (end-face cracks)" such as end face unevenness may occur from the bottoms of the voids 3. However, in accordance with the construction of FIG. 10, such end-face cracks can be effectively prevented from traversing the active layer 13 below the ridge stripe. If an end-face crack traverses the active layer, there occur problems in that the threshold current may increase and the laser beam shape (far field pattern) may be disturbed. However, adopting the construction of FIG. 10 will solve such problems. Since the depth of the active layer 13 is about 0.6 µm from the crystal surface, it can be easy ensured that the bottoms of the voids 3 are located below the active layer 13.

Also in a semiconductor laser device shown in FIG. 11, the voids 3 are formed at positions which are deeper than the position of the active layer 13. A difference from the construction of FIG. 10 is that both sides of the optical waveguide region (light-emitting region) 18 are etched deep, and the voids 3 are formed at positions which are below the active layer 13. In accordance with the construction of FIG. 11, end-face cracks beginning from the voids 3 will never traverse the active layer 13. In this case, the voids 3 may be formed so as to be shallow.

In a semiconductor laser device shown in FIG. 12, trenches (isolation grooves) are formed between the voids 3 and the optical waveguide region (light-emitting region) 18. In accordance with the construction of FIG. 12, progress of end-face cracks beginning from the voids 3 will be interrupted by the trenches 35. Moreover, if the trenches 35 are formed with a depth that traverses the active layer 13, end-face cracks caused by the trenches 35 will not traverse the active layer 13 either. It suffices if such trenches 35 are formed only between the voids 3 and the optical waveguide region (light-emitting region) 18, but each such trench 35 may also be formed across the entire region shown by broken lines in FIG. 12. Trenches can be formed more suitably by a dry etching technique which provides a high level of anisotropy.

The constructions shown in FIGS. 10 to 12 exhibit particular effects in the case where the chip width is reduced. In future, there will be a desire to obtain as large a number of chips from a single wafer as possible. In such cases, it will be preferable to reduce the chip width by adopting the constructions shown.

Embodiment 2

Figure 13:
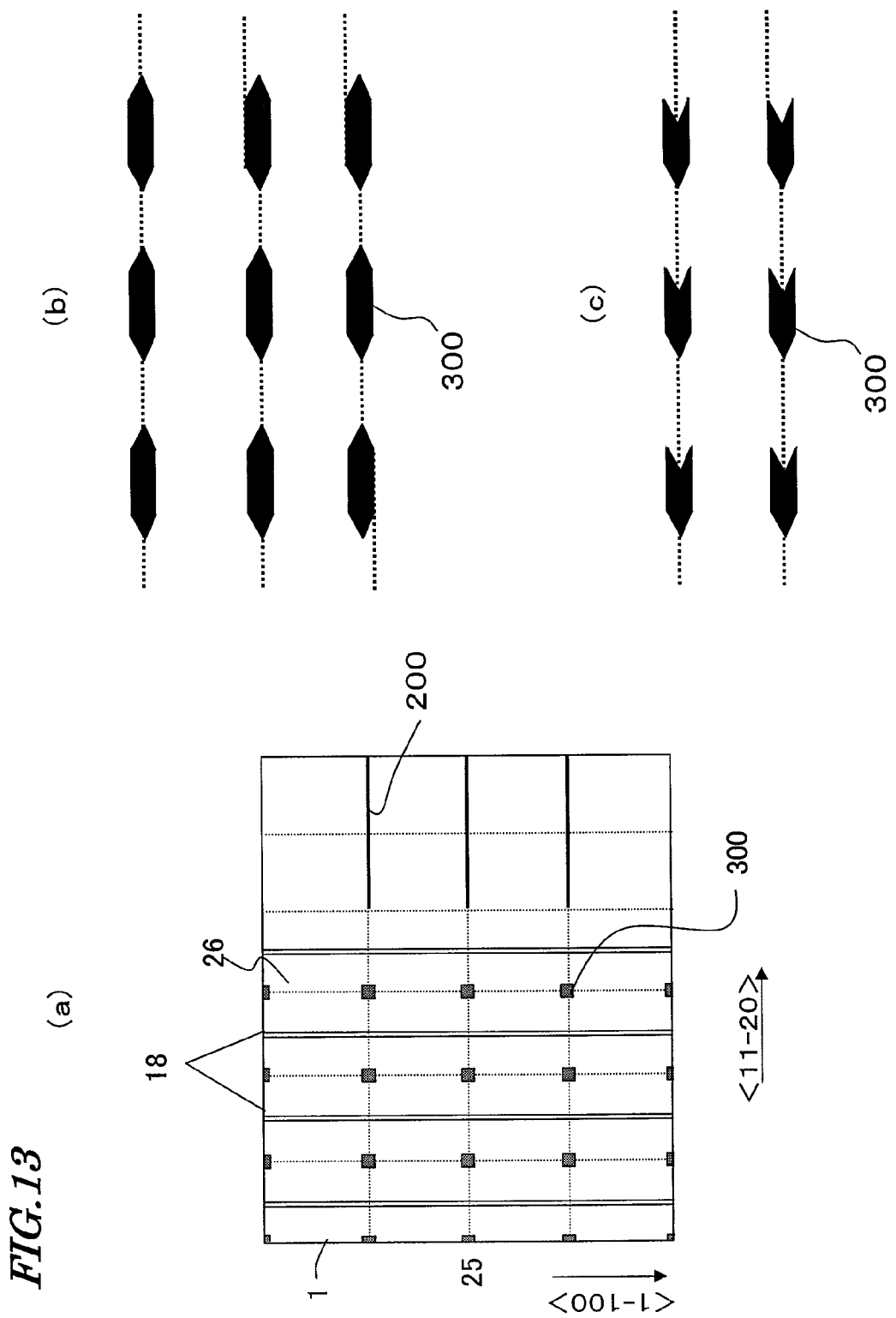
[FIG. 13] (a) is an upper plan view showing an arrangement of voids 300 according to Embodiment 2 of the present invention; (b) is a plan view showing a shape of the voids 300; and (c) is a plan view showing another shape of the voids 300.

FIG. 13(*a*) is a plan view showing the neighborhood of an end of the wafer 1 according to the present embodiment. In FIG. 13(*a*), a plurality of edge scribings 200 for defining cleavage start positions are shown. The edge scribings 200 are linear grooves which are formed on the surface of the wafer 1 (peripheral region) by a known instrument such as a scribing tool. The edge scribings 200 are formed at positions where the surface of the wafer 1 intersects the cleavage intended planes, and their length is set to 0.1 to 1 mm, for example. By applying a physical force near such edge scribings 200, cleavage is allowed to begin and progress.

What is characteristic of the present embodiment is the shape of the voids 300 in a plane which is parallel to the surface of the wafer 1. FIG. 13(*b*) is a plan view of the voids 300 in the present embodiment. As is shown in this figure, each void 300 has an anisotropic shape with a longitudinal axis extending along the cleavage direction, both ends being pointed. Each void 300 has a length (size along the longitudinal axis direction) of 5 to 60 µm, for example, and a size along the shorter axis direction (width and depth) of 3 µm, for example.

With such voids 300, if a cleavage direction deviates between adjoining voids 300 from an intended line, the start position of a next-occurring cleavage will be corrected so as to be on the intended line. In the case where the width of the voids 300 is set to 3 µm, the deviation of a cleavage can be suppressed to 3 µm or less. However, in order to obtain the effects described with reference to FIGS. 8(*a*) and (*b*), it is necessary to limit the length of the voids 300 along the cleavage direction; this length is preferably set to 45 μm or less, and more preferably 20 μm or less.

Note that, since cleavage will progress in one direction (from right to left in the figure) from the region where the edge scribings 200 are provided, it is preferable that each void 300 has an "arrow shape" as shown in FIG. 13(*c*). Each void 300 shown in FIG. 13(*b*) has "two wings" for receiving a cleavage plane which extends from an adjoining void on the right side in the figure. These wings have a function of reducing deviation of cleavage planes. Voids 300 having such a shape may be difficult to form by the method shown in FIG. 5(*b*), but can be easily formed by using a known photolithography and etching technique.

Figure 14:
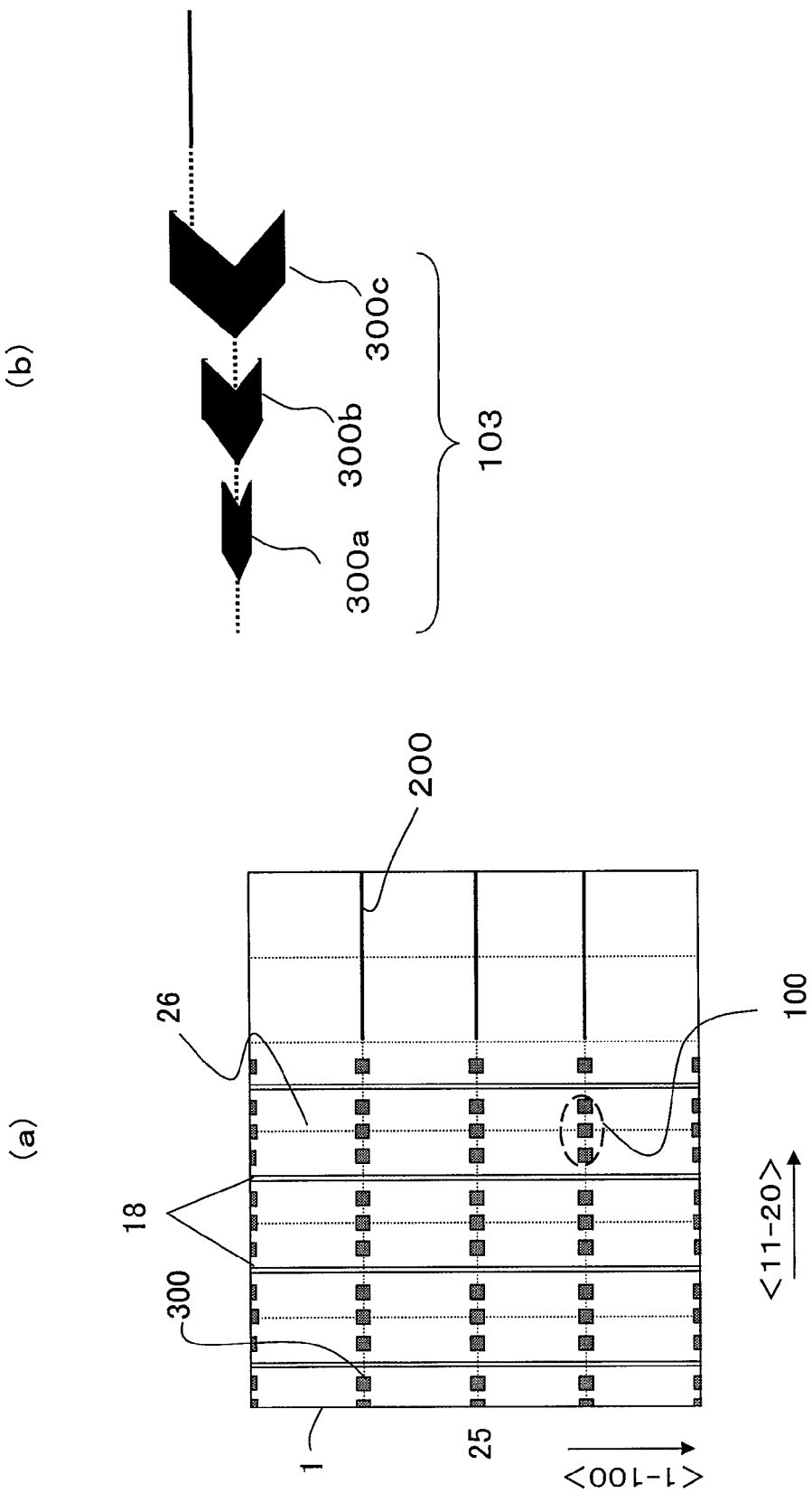
[FIG. 14] (a) is an upper plan view showing another arrangement of the voids 300 according to Embodiment 2 of the present invention; and (b) is a plan view showing shapes of voids 300a, 300b, and 300c.

FIG. 14(*a*) is a plan view showing an example where the voids 300 are arranged with a relatively high density as compared to the example shown in FIG. 13(*a*). The voids 300 may all be of the same size, but as shown in FIG. 14(*b*), for example, a structural unit may be constituted by a plurality of voids 300*a*, 300*b*, and 300*c* of different shapes and/or sizes. The voids 300*a*, 300*b*, and 300*c* shown in FIG. 14(*b*) each have "two wings" for receiving a cleavage plane extending from an adjoining void. Thus, by arranging the plurality of voids 300*a*, 300*b*, and 300*c* having different sizes of wings as shown in FIG. 14(*b*) in the order of their wing size, it becomes possible to allow the positions of the cleavage planes, which begin to extend from the edge scribings 200, to be guided onto the intended lines with a high accuracy.

There is a tendency that a deviation of a cleavage plane increases as the interval between adjoining voids 300 increases. Therefore, it is preferable to adjust the sizes of wings depending on the interval between adjoining voids 300 or the arraying pitch of the voids 300. Although voids 300*a*, 300*b*, and 300*c* with different sizes of wings are arranged in FIG. 15(*b*), it is also possible to use only one type of voids (e.g., voids 300*c* with relatively large wings) for a single wafer 1.

Figure 15:
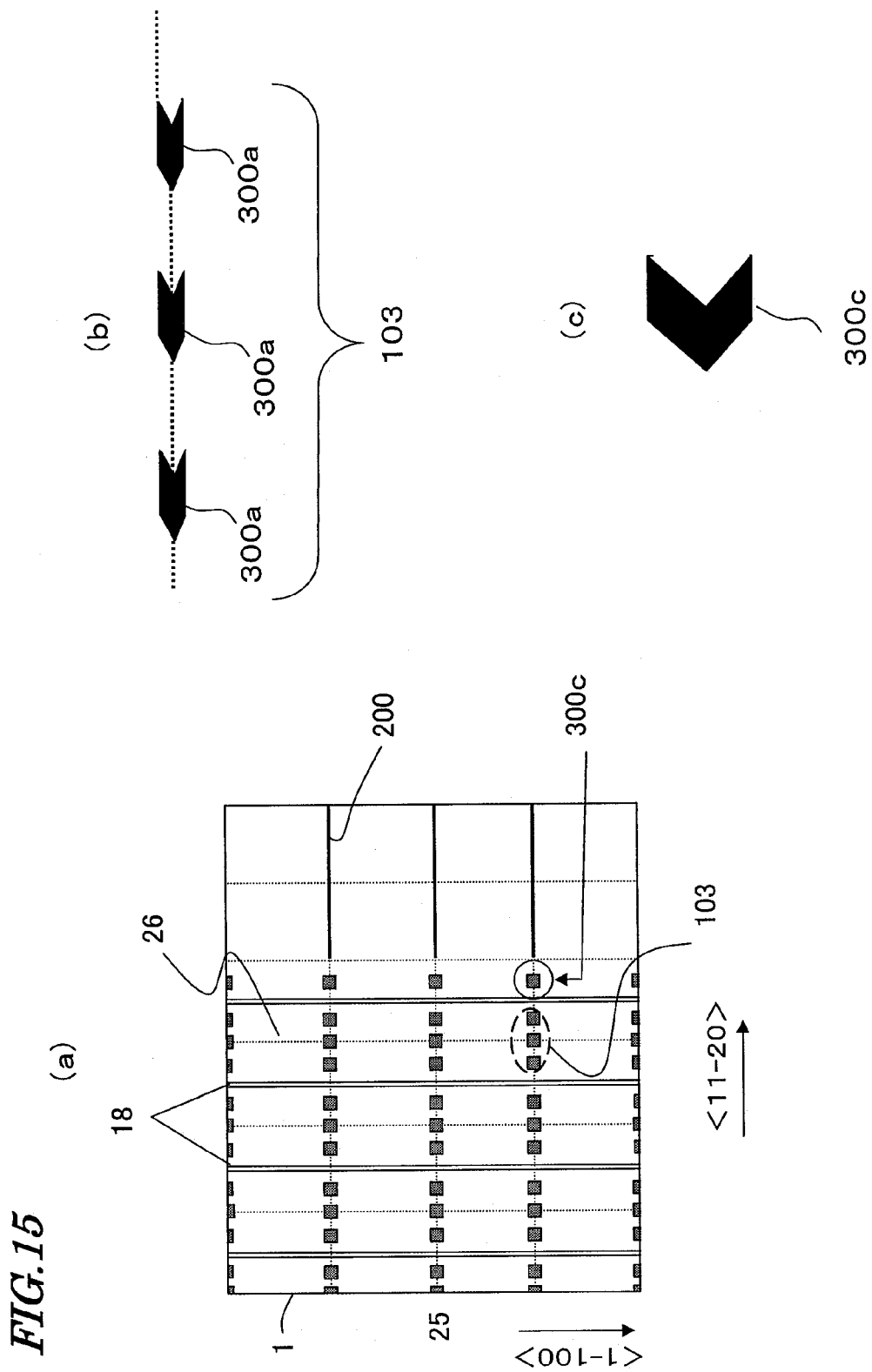
[FIG. 15] (a) is an upper plan view showing another arrangement of the voids 300 according to Embodiment 2 of the present invention; (b) is a plan view showing a structural unit based on voids 300a; and (c) is a plan view showing a void 300c which is provided at a position near an edge scribing.

It is preferable that those voids 300 which are provided at positions closest to the edge scribings 200 have relatively large wings as compared to the voids which are formed in the other regions. In the example shown in FIG. 15(*a*), voids 300*a* as shown in FIG. 15(*b*) are arranged in a large part of the wafer 1, whereas voids 300*c* as shown in FIG. 15(*c*) are disposed at positions closest to the edge scribings 200.

Note that it is also possible to provide the voids 300*a*, 300*b*, and 300*c* shown in FIG. 14(*b*), in this order, only in the region near the edge scribings 200.

INDUSTRIAL APPLICABILITY

As lasers for short-wavelength light sources employing GaN substrates which are difficult to be cleaved, mass production of nitride compound semiconductor lasers according to the present invention is expected.

The invention claimed is:

1. A production method for a nitride compound semiconductor element including a substrate having an upper face and a lower face and a multilayer structure supported by the upper face of the substrate, the production method comprising:
    a step of providing a wafer to be split into the substrate;
    a step of growing a plurality of semiconductor layers composing the multilayer structure on the wafer; and
    a step of performing cleavage of the wafer and the multilayer structure to form a cleavage plane,
    further comprising a step of arranging a plurality of voids at positions where the cleavage plane is to be formed,
        wherein at least one of the plurality of voids is shaped so as to have a longitudinal axis along a cleavage direction,
    wherein a cross section of each void in a plane which is parallel to the wafer is sized and shaped so as to be accommodated within a rectangular region of 10 μm×10 μm.

2. The production method of claim 1, wherein the step of arranging the plurality of voids comprises a step of pressing a tip of a needle piece against an upper face of the multilayer structure to form depressions on the multilayer structure, the depressions functioning as the voids.

3. The production method of claim 2, wherein an angle formed between a direction which is perpendicular to the wafer and a pressing direction when the tip of the needle piece is abutted against the upper face of the multilayer structure is set to 5° or more.

4. The production method of claim 2, wherein the nitride compound semiconductor element is a semiconductor laser having as a resonator end face a cleavage plane which is parallel to a plane containing the pressing direction.

5. The production method of claim 1, wherein
    the plurality of semiconductor layers have an active layer, and the plurality of voids are formed so as to be deeper than the position of the active layers.

6. The production method of claim 1, wherein
    an optical waveguide is formed in the multilayer structure, and a plurality of trenches are formed between the plurality of voids and the optical waveguide.

* * * * *